United States Patent
Nam

(10) Patent No.: US 7,309,661 B2
(45) Date of Patent: Dec. 18, 2007

(54) METHOD FOR FORMING GATE OF SEMICONDUCTOR DEVICE

(75) Inventor: Ki Won Nam, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 373 days.

(21) Appl. No.: 11/109,909

(22) Filed: Apr. 20, 2005

(65) Prior Publication Data
US 2005/0245033 A1 Nov. 3, 2005

(30) Foreign Application Priority Data
Apr. 29, 2004 (KR) .................. 10-2004-0030244

(51) Int. Cl.
*H01L 21/31* (2006.01)
*H01L 21/469* (2006.01)

(52) U.S. Cl. .................. 438/778; 438/785; 257/E21.63
(58) Field of Classification Search ................ 439/149; 257/E21.639, E29.042; 438/778, 786, 149
See application file for complete search history.

(56) References Cited

U.S. PATENT DOCUMENTS 5,977,601 A * 11/1999 Yang et al. .................. 257/437
5,998,100 A * 12/1999 Azuma et al. .............. 430/313

\* cited by examiner

*Primary Examiner*—Caridad Everhart
(74) *Attorney, Agent, or Firm*—Ladas & Parry LLP

(57) ABSTRACT

Disclosed is a method for forming a gate of a semiconductor device capable of preventing a bridge from being created between adjacent gates due to a nitride polymer. The method includes the steps of forming a gate oxide film, a gate poly-Si film, and a gate W film successively on a semiconductor substrate; forming a pure SiN film and an oxide-rich SiN film successively on the gate W film as hard mask films; forming an oxide-rich SiON film on the oxide-rich SiN film as an anti-reflective coating film; patterning the oxide-rich SiON film, the oxide-rich SiN film, and the pure SiN film into the shape of a gate; and etching the gate W film, the gate poly-Si film, and the gate oxide film successively using the patterned pure SiN film as an etching barrier.

8 Claims, 4 Drawing Sheets

METHOD FOR FORMING GATE OF SEMICONDUCTOR DEVICE

BACKGROUND OF THE INVENTION

1. Field of the invention

The present invention relates to a method for forming a gate of a semiconductor device, and more particularly to a method for forming a gate of a semiconductor device capable of preventing a bridge from being created between gates due to a polymer.

2. Description of the Prior Art

As generally known in the art, the recent tendency towards high integration of semiconductor devices is followed by reduced line width of gates, as well as reduced spacing between gates. As the spacing between gates is reduced, however, a bridge is likely to be created between adjacent gates. This fatally affects the yield rate.

When forming gates, therefore, it is important not only to satisfy the characteristics required by highly integrated devices, but also to prevent a bridge from being created between adjacent gates.

FIGS. 1A and 1B are sectional views showing processes for forming a gate of a semiconductor device according to the prior art.

Referring to FIG. 1A, a gate oxide film 12 is grown on a semiconductor substrate 11 with a thickness of about 54 Å. A poly-Si film 13 and a W film 14 are then deposited on the gate oxide film 12 with a thickness of about 830 Å and 1000 Å, respectively, as gate conductive films.

Subsequently, a SiN film 15 is deposited on the W film 14 with a thickness of about 2100 Å as a hard mask film and a nitride-rich SiON film 16 is deposited on the SiN film with a thickness of about 600 Å as an ARC (anti-reflective coating) film. When the nitride-rich SiON film 16 is deposited, $SiH_4$, $N_2O$, and He are mixed at a flow rate ratio of 70 sccm: 80 sccm: 2200 sccm.

A photosensitive film is then applied on the nitride-rich SiON film 16, which is exposed to light and developed to form a photosensitive film pattern 17 defining a gate formation region.

Referring to FIG. 1B, the photosensitive film pattern is used as an etching mask to etch the nitride-rich SiON film 16 and the SiN film 15 successively. The photosensitive film pattern is then removed in a strip process. Subsequently, the etched SiN film 15 is used as an etching barrier to etch the W film 14, the polySi film 13, and the gate oxide film 12 successively to form a gate 18.

However, the above-mentioned conventional method for forming a gate has a problem as follows:

When the W film and the poly-Si film are etched, in general, a large amount of polymer is created depending on the physical property of the films reacting with the etching gas, i.e., HBr and $O_2$ gases. Particularly, a large amount of nitride component included in the SiON film and the SiN film reacts with the etching gas and creates a large amount of nitride polymer. Such creation of a nitride polymer may be inevitable in a gate etching process requiring high etching selectivity with a gate thin oxide.

As the design rule of devices is reduced to 0.12 µm or less, the spacing between gates decreases and the nitride polymer creates a bridge between adjacent gates. Specifically, the large amount of nitride polymer created by the etching gas and the etching material acts as an etching stop film. As a result, the stable gate etching fails and a bridge is created between adjacent bridges.

SUMMARY OF THE INVENTION

Accordingly, the present invention has been made to solve the above-mentioned problems occurring in the prior art, and an object of the present invention is to provide a method for forming a gate of a semiconductor device capable of preventing a bridge from being created between adjacent gates due to creation of excessive polymer.

In order to accomplish this object, there is provided a method for forming a gate of a semiconductor device including the steps of forming a gate oxide film, a gate poly-Si film, and a gate W film successively on a semiconductor substrate; forming a pure SiN film and an oxide-rich SiN film successively on the gate W film as hard mask films; forming an oxide-rich SiON film on the oxide-rich SiN film as an anti-reflective coating; patterning the oxide-rich SiON film, the oxide-rich SiN film, and the pure SiN film into the shape of a gate; and etching the gate W film, the gate poly-Si film, and the gate oxide film successively using the patterned pure SiN film as an etching barrier.

The pure SiN film is formed with a thickness of 1800-2000 Å using a mixture of $SiH_4$ and $N_2$.

The oxide-rich SiN film is formed with a thickness or 200-300 Å using a mixture of $SiH_4$ and any oxygen-including gas chosen from a group comprising $N_2O$, $CO_2$, and $O_2$.

The oxide-rich SiON film is formed with a thickness of 550-650 Å using a mixture of 100-180 sccm of $SiH_4$, 50-100 sccm of $N_2O$, and 2000-2200 sccm of He under a condition of plasma power of 200 W or less, pressure of 3-8 Torr, and temperature of 300° C. or higher.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
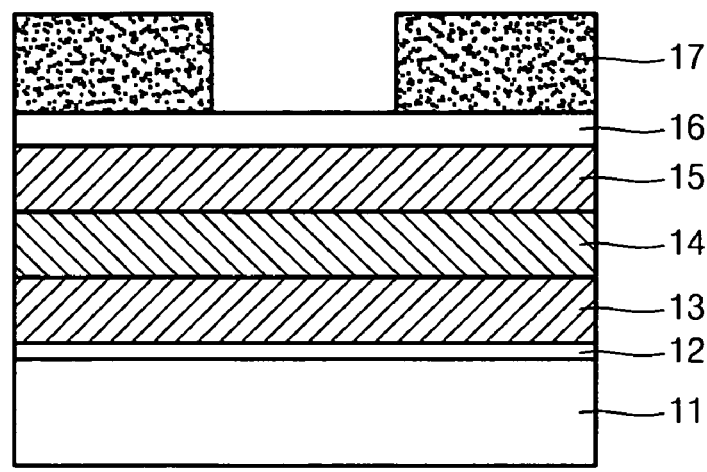
FIGS. 1A and 1B are sectional views showing processes for forming a gate of a semiconductor device according to the prior art and FIGS. 2A to 2E are sectional views showing processes for forming a gate of a semiconductor device according to an embodiment of the present invention.
Figure 1B:
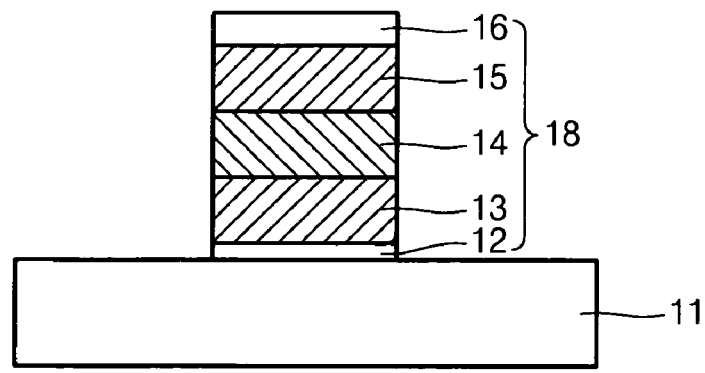

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2A to 2E are sectional views showing processes for forming a gate of a semiconductor device according to an embodiment of the present invention.

Figure 2A:
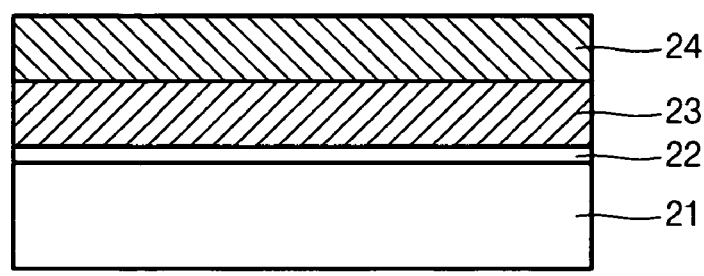

Referring to FIG. 2A, a gate oxide film 22 is grown on a semiconductor substrate 21 with a thickness of 50-60 Å. A poly-Si film 23 and a W film 24 are deposited on the gate oxide film 22 with a thickness of 800-900 Å and 900-1100 Å, respectively, as gate conductive films. The W film may be replaced by a W-silicide film.

Figure 2B:
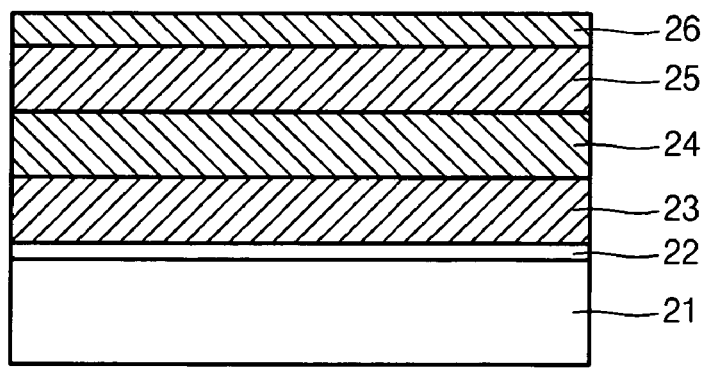

Referring to FIG. 2B, a pure SiN film 25 and an oxide-rich SiN film 26 having a large proportion of oxide are successively formed as hard mask films which play the role of etching barriers when the gate conductive films are etched on the W film 24, as well as means for securing aligning margin in the following self-aligned contact (SAC) process for forming a landing plug contact. The pure SiN film 25 is formed with a thickness of 1800-2000 Å using a mixture gas of $SiH_4$ and $N_2$. The oxide-rich SiN film 26 is formed in the same chamber as in the case of forming the pure SiN film 25 using a mixture gas of $SiH_4$ and any oxygen-including gas chosen from $N_2O$, $CO_2$, and $O_2$, instead of $N_2$.

When the gate conductive films are etched in the following process, they are removed from the top of the hard mask films with a thickness of 200 Å or less. This acts as a source of polymer creation. Therefore, the oxide-rich SiN film 26 on top of the pure SiN film 25 is formed with a thickness of at least 200 Å, preferably 200-300 Å, to prevent a nitride polymer from being created in the following process for etching the gate conductive films.

Figure 2C:
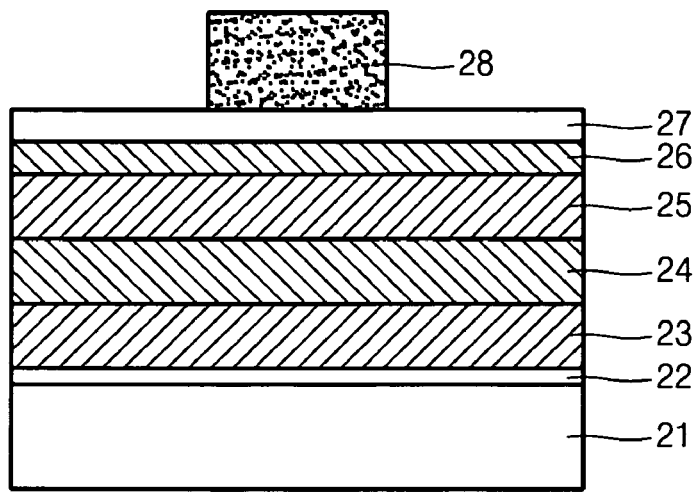

Referring to FIG. 2C, an oxide-rich SiON film 27 is formed on the oxide-rich SiN film 26 with a thickness of 500-700 Å as an ARC film. The nitride within the SiON film may create a polymer as in the case of the pure SiN film. For this reason, the present invention uses an oxide-rich SiON film 27 including a large amount of oxide, instead of a conventional nitride-rich SiON film, as the ARC film.

When the oxide-rich SiON film 27 is formed, $SiH_4$, $N_2O$, and He are mixed in such a manner that the $SiH_4$ gas has a larger flow rate than in a conventional case and a large amount of oxide is included in the film. A conventional nitride-rich SiON film is formed by mixing $SiH_4$, $N_2O$, and He at a flow rate ratio of 70 sccm: 180 sccm: 2200 sccm. In the case of the inventive oxide-rich SiON film 27, however, the $N_2O$ gas has a flow rate 50-100 sccm, which is reduced from 180 sccm, and the $SiH_4$ gas has a flow rate of 100-180 sccm, which is increased from 70 sccm, to increase the proportion of oxide. In addition, the oxide-rich SiON film 27 is formed under a condition of plasma power of 200 W or less, pressure of 3-8 Torr, and temperature of 300° C. or higher to remove moisture within the film.

Subsequently, a photosensitive film is applied on the oxide-rich SiON film 27, which is exposed to light and developed to form a photosensitive film pattern 28 defining a gate formation region.

Figure 2D:
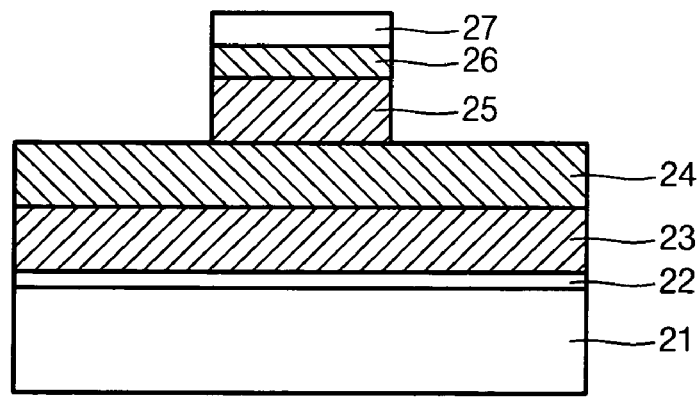

Referring to FIG. 2D, the photosensitive film pattern is used as an etching mask to etch the oxide-rich SiON film 27, the oxide-rich SiN film 26, and the pure SiN film 25 successively. The remaining photosensitive film pattern is removed in a strip process.

Figure 2E:
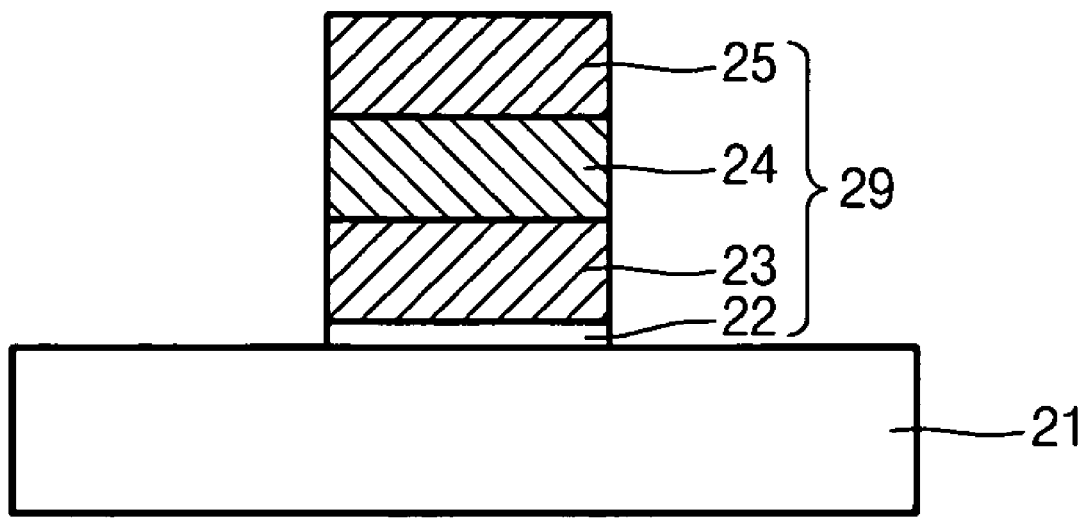

Referring to FIG. 2E, the pure SiN film 25 is used as an etching barrier to successively etch the gate W film 24, the gate poly-Si film 23, and the gate oxide film 22 to form a gate 29. The oxide-rich SiN film and the oxide-rich SiON film on the pure SiN film 25 are completely removed when the gate W film 24, the gate poly-Si film 23, and the gate oxide 22 are etched.

Among the films used as etching barriers, any film acting as a source of a nitride polymer is converted to an oxide-rich film so that little nitride polymer is created. As such, the present invention prevents a nitride polymer from being created and, consequently, prevents a bridge from being created between adjacent gates due to the nitride polymer.

As mentioned above, the present invention converts the ARC film and the nitride film of the hard mask film acting as a source of a nitride polymer residue to oxide-rich films including a large amount of oxide and efficiently prevents a nitride polymer from being created during gate etching. Thus, the present invention can prevent a bridge from being created between adjacent gates due to creation of a nitride polymer and guarantees the reliability of semiconductor devices and semiconductor device formation processes.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a gate of a semiconductor device comprising the steps of:
   forming a gate oxide film, a gate poly-Si film, and a gate W film successively on a semiconductor substrate;
   forming a pure SiN film and an oxide-rich SiN film successively on the gate W film as hard mask films;
   forming an oxide-rich SiON film on the oxide-rich SiN film as an anti-reflective coating film;
   patterning the oxide-rich SiON film, the oxide-rich SiN film, and the pure SiN film into the shape of a gate; and
   etching the gate W film, the gate poly-Si film, and the gate oxide film successively using the patterned pure SiN film as an etching barrier.

2. The method for forming a gate of a semiconductor device as claimed in claim 1, wherein the pure SiN film is formed with a thickness of 1800-2000 Å.

3. The method for forming a gate of a semiconductor device as claimed in claim 1, wherein the pure SiN film is formed using a mixture of $SiH_4$ and $N_2$.

4. The method for forming a gate of a semiconductor device as claimed in claim 1, wherein the oxide-rich SiN film is formed with a thickness of 200-300 Å.

5. The method for forming a gate of a semiconductor device as claimed in claim 1, wherein the oxide-rich SiN film is formed using a mixture of $SiH_4$ and any oxygen-including gas chosen from a group comprising $N_2O$, $CO_2$, and $O_2$.

6. The method for forming a gate of a semiconductor device as claimed in claim 1, wherein the oxide-rich SiON film is formed with a thickness of 550-650 Å.

7. The method for forming a gate of a semiconductor device as claimed in claim 1, wherein the oxide-rich SiON film is formed using a mixture of 100-180 sccm of $SiH_4$, 50-100 sccm of $N_2O$, and 2000-2200 sccm of He.

8. The method for forming a gate of a semiconductor device as claimed in claim 1, wherein the oxide-rich SiON film is formed under a condition of plasma power of 200 W or less, pressure of 3-8 Torr, and temperature of 300° C. or higher.

* * * * *